United States Patent [19]

Thornburg

[11] 4,223,088
[45] Sep. 16, 1980

[54] METHOD OF FORMING DEFINED CONDUCTIVE PATTERNS IN A THIN GOLD FILM

[75] Inventor: David D. Thornburg, Los Altos, Calif.

[73] Assignee: Xerox Corporation, Stamford, Conn.

[21] Appl. No.: 6,628

[22] Filed: Jan. 26, 1979

Related U.S. Application Data

[63] Continuation-in-part of Ser. No. 814,356, Jul. 11, 1977, abandoned.

[51] Int. Cl.² .............................................. G03C 5/00
[52] U.S. Cl. ................................... 430/323; 156/637; 156/645; 156/656; 156/657; 156/662; 156/659.1; 430/317; 430/325
[58] Field of Search ................ 96/36, 36.2, 38.1, 38.2, 96/38.3; 156/637, 656, 657, 645, 659, 662; 430/323, 325, 317

[56] References Cited

U.S. PATENT DOCUMENTS

| | | | |
|---|---|---|---|
| 1,922,434 | 8/1933 | Gundlach | 96/38.3 |
| 2,399,799 | 5/1946 | Guellich | 96/38.3 |
| 2,435,889 | 2/1948 | Kerridge | 96/38.1 |
| 3,634,159 | 1/1972 | Croskery | 156/656 |
| 3,832,230 | 8/1974 | Terry | 156/656 X |
| 3,846,196 | 1/1974 | MacArthur et al. | 156/656 |
| 3,962,004 | 6/1976 | Sonneborn | 156/637 |
| 3,986,876 | 10/1976 | Abita | 96/38.3 |

OTHER PUBLICATIONS

Kodak Publication P-79, Aug. 30, 1967, pp. 15-16.
Kodak Publication P-131, Dec. 18, 1969, p. 31.

*Primary Examiner*—Edward C. Kimlin
*Attorney, Agent, or Firm*—W. Douglas Carothers, Jr.

[57] ABSTRACT

A method of forming a defined conductive pattern in a laminar film comprising a thin gold layer interposed between an insulating substrate and a ceramic overlay is disclosed. A base etchant is employed to remove the thin ceramic layer but itself will not etch or remove the gold film layer. Upon removal of the ceramic layer, the exposed gold layer may be removed without any chemical treatment or assistance. Such removal may, for example, be accomplished by fluid agitation or exposure to a fluid stream or by swabbing. A pretreatment of the film surface prior to etching enhances the adhesion of the photoresist subsequently applied to the film surface.

8 Claims, 3 Drawing Figures

METHOD OF FORMING DEFINED CONDUCTIVE PATTERNS IN A THIN GOLD FILM

CROSS-REFERENCE TO RELATED APPLICATION

This is a continuation-in-part of Ser. No. 814,356 filed July 11, 1977, now abandoned.

BACKGROUND OF THE INVENTION

Photolithography is a well known technique in the prior art for selectively etching the surface of a member, the surface of the member comprising a metal or semiconductor material to form a desired pattern on the underlying substrate of the member. Typically, a photoresist is applied to the surface of the material, the photoresist is exposed to light in the desired pattern to harden the photoresist in the areas upon which light is incident (negative photoresist), the member is placed in an etchant to remove the non-hardened areas of the photoresist and the underlying material and the member is then rinsed and the remaining photoresist removed.

The application of photolithographic techniques for forming defined patterns in noble metals such as gold has generally been ignored in the prior art since these metals are difficult to etch using commercially available strong and toxic etchants. Further, although certain traditional etches, such as aqua regia, can etch a gold coating formed on a substrate, for example, this etchant must be applied selectively and directly to the gold coating without contacting other portions of the coating or the substrate since aqua regia is a solvent for most materials. This also precludes the use of many photoresists since aqua regia would remove both the hardened and non-hardened portions of the photoresist.

Other traditional etchants for gold, besides aqua regia, are iodine solutions and alkali cyanide solutions. Aqua regia and elemented iodine are very caustic materials and can potentially produce very toxic chemicals. Accidential acidity of cyanide solutions can produce very posionous hydrogen cyanide gases.

For reasons similar to that described above, photolithography has not been utilized to define conductive patterns in gold coatings when the gold coating is interposed between two layers of material, such as a transparent dielectric substrate and a thin ceramic layer, forming an electrically conductive film.

A film of this type, known as Intrex film, is commercially available from the Sierracin Corporation, Sylmar, California. This film comprises a polyester base on which is deposited a transparent gold coating followed by deposition of a very thin ceramic layer to improve adhesion, scratch resistance and transparency of the film. Films thus formulated are very rugged and have low cost. Major uses for these films include de-icing layers for aircraft windshields and other large area applications. Additional applications for this film can be determined since the film is available in a variety of sheet resistivities which range from approximately 5 to 30 ohms per square, the cost per square foot being generally low.

While many applications for this Intrex film can incorporate cut sheets of the material without any operations on the underlying gold coating as set forth hereinabove, additional applications are only possible if the conductive gold coating is further defined into a pattern which provides a desired device function. For example, touch sensitive keyboards can be made with Intrex film by defining an appropriate and accurate pattern into the gold coating. Similarly, consumable credit cards can be made at low cost using this film by defining a specific and accurate pattern for the required heater array in the gold coating.

The Sierracin Intrex film set forth hereinabove has provided pattern definition on the gold conductive coating by utilizing techniques other than photolithography which include razor blade scribing of the gold coating or electrical burn-off using a pointed stylus coupled to an electrical source. Both of these techniques are tedious, expensive and unreliable and makes the latter recited applications non-cost effective when compared to other conductive films commercially available. Further, the use of aqua regia to etch the gold is not practical since the underlying substrate and/or ceramic layer may be damaged and its use must be handled with extreme care due to its toxic and caustic nature.

It would therefore be desirable if a technique for forming pattern definitions on a thin conductive metal interposed between two layers of material can be provided, and, in particular, to provide a technique for defining a pattern in the Intrex gold coating which is less expensive and less dangerous and yet more reliable and safe than the techniques presently being utilized.

SUMMARY OF THE PRESENT INVENTION

Accordingly, the present invention provides a photolithography method for defining patterns on a film comprising a gold conductive coating interposed between a transparent dielectric member and a thin transparent ceramic over layer. In particular, a suitable base resistant resist covers the surface of the conductive member. The desired pattern is produced in the photoresist by using a suitable mask and exposing the resist therethrough with light from a suitable light source. The non-exposed areas of the photoresist are removed during the development of the photoresist. The film is immersed in a base etchant, typically a 10% by weight solution of potassium hydroxide and water. The thin ceramic overlayer is removed in the non-pattern areas, thereby exposing the gold layer. The exposure of the gold layer permits its removal chemically unassisted by the base etchant. The gold layer in these exposed areas is believed to be released from its film base due to removal of the ceramic layer. The thin ceramic layer provides mechanical adhesion of the sandwiched gold layer to the film base. When etched away in pattern exposed areas, the underlying gold layer is removed without any chemical assistance, such as, by fluid agitation within the fluid medium or the application of such medium against the exposed gold layer. Removal can also be accomplished by swabbing the exposed layer with swabbing material or device, either in the absence or presence of the fluid medium, the latter of which is preferred.

After the exposed surface material away, the film is rinsed and the photoresist pattern is removed by conventional techniques to leave a defined pattern in the film gold coating.

It is an object of the present invention to provide a method for etching a laminar film having a sandwiched metallic layer without the need of employing toxic or caustic etchants.

It is a further object of the present invention to provide a lithography method for defining patterns in a transparent film having a gold layer interposed between a transparent insulating dielectric substrate and a thin transparent ceramic overlayer.

DESCRIPTION OF THE DRAWINGS

For a better understanding of the invention as well as other objects and further features thereof, reference is made to the following description which is to be read in conjunction with the accompanying drawings wherein.

DESCRIPTION OF THE PREFERRED EMBODIMENT

Figure 1:
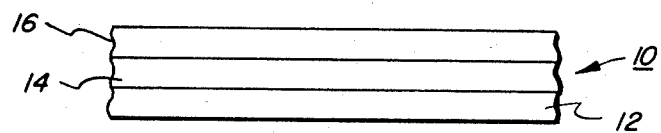
FIG. 1 illustrates the film upon which the method of the present invention is utilized.

Referring now to FIG. 1, the method of the present invention is preferably utilized to form desired conductive patterns in the metallic layer 14 in a film 10. The film 10 comprises a transparent dielectric substrate 12 upon which is vacuum deposited a transparent, electrically conductive metallic thin film or layer 14. The metal layer 14 is, in turn, overcoated with a very thin ceramic layer 16. Typically, the thickness of the substrate 12 is approximately 3 mils and the thickness of coating 14 is in the range from approximately 150–300 A. It should be noted that the electrical characteristics of film 10 is specified primarily by the desired area or sheet resistivity (typically in the range from 5 to 30 ohms per square) which is determined by the thickness of layer 14. The thickness of layer 14 can therefore be considered to be variable. The dielectric substrate 12 is a polyester material, such as Mylar. Layer 14 comprises a thin conductive layer of gold, and layer 16 comprises titanium oxide which serves to improve adhesion of the gold layer 14 to substrate 12 and provides protection to layer 14 from scratching while permitting increased visible light transmission (i.e., acts as an anti-reflection coating), the latter characteristic being a factor for determining the thickness of layer 16. The thickness of layer 16 may be as thin as or thinner than that of layer 14. A film which comprises the preferred components set forth hereinabove is commercially available from the Sierracin Corporation, of Sylmar, California, in sheet form and is referred to as Intrex film, Intrex being a trademark of Sierracin Corporation.

Intrex is described generically by Sierracin as an electrically conductive film which comprises a continuous, transparent, electrically conductive coating formed on a polyester layer. The conductive coating is a vacuum deposited metallic thin film, the thickness of which varies the resistivity and the optical transmission levels of the laminar film. The metal is overcoated with a ceramic coating which serves to increase visible light transmission and to provide mechanical protection to the conductive metallic layer, the ceramic coating also exhibiting electrical conductivity because of its extreme thinness.

In many applications it is desired to form conductive patterns in layer 14. The prior art techniques to form a defined conductive pattern in coating 14 included using a razor blade for scribing or electrical burn-off using a pointed stylus connected to an electrical source. It is obvious that both these techniques are tedious, expensive and unreliable when compared to pattern definition performed by photolithography. For example, utilizing the razor blade or stylus may detrimentally effect the optical properties of substrate 12.

In accordance with the method of the present invention, a lithographic method, preferably a photolithographic method, is utilized to define conductive patterns in layer 14. For purposes of illustration, the method will be described with reference to the commercially available Intrex film although the method may be used successfully with any other similarly constructed laminar film.

The following examples are illustrative of method of forming a defined conductive pattern in a laminar film as previously discussed and hereinafter claimed.

EXAMPLE I

The process preferably begins with a pretreatment of the laminar film 10. A 5% mixture of 1, 1, 1, 3, 3, 3 hexamethyldisilazane in Stoddard Solvent is provided into which the film is initially immersed. This treatment has been found to provide good adhesion promotion between the subsequently applied photoresist and the surface of film 10 and prevent potentially undesirable removal of the photoresist during the etching step. The pretreatment requires only that the film be submerged in the pretreatment solution to contact the entire surface of the film and then removed from the solution. Although this pretreatment is not essential, it is preferred as a matter of ensurance.

Figure 2A:
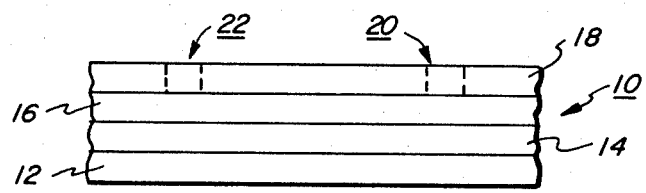
FIGS. 2a and 2b illustrate the film shown in FIG. 1 at various stages of application of the photolithography method of the present invention.

Next, as illustrated in FIG. 2a, a suitable base resistant resist 18 is applied uniformly to cover the surface of ceramic layer 16. The photoresist chosen is a Riston dry film photoresist, Dupont 211R. A desired pattern is produced on layer 16 by exposing the layer to light from an appropriate light source, such as ultraviolet light, through a masking pattern having the desired pattern formed thereon, as is well known in the photolightography art. Exposure may be approximately 25 seconds.

For illustrative purposes, it has been assumed as shown in FIG. 2a that areas 20 and 22 have been exposed to the appropriate ultraviolet light through a masking pattern (not shown) to form a defined hardened pattern in the photoresist layer 18, the non-exposed photoresist areas being removed during development of the photoresist in a devlopment solution heated and maintained at about 50° C.

It should be noted that other types of photoresists may be utilized which are processed by exposure for removal in areas exposed to the light, such as, positive type photoresists.

Although a photolithographic method for forming the desired pattern by operating on a photoresist is set forth hereinabove, an alternate lithographic method which is also suitable would be to apply a resin based etched resistant material in the desired pattern by utilizing silk screening techniques, the steps of light exposure and resist development not being necessary. Either of these lithographic methods, it should be clear, may be utilized to form the etch resistant pattern on the surface of the ceramic layer 16.

The film is then removed from the development solution and blown dry. Nitrogen gas may be employed for this purpose.

After pattern definition by either method described hereinabove, the film 10 is immersed in a base etchant, potassium hydroxide, for approximately 45 seconds at approximately 45° C. It has been found that a base etchant, such as a 10% by weight solution of potassium hydroxide in water, will provide a successful etch on layer 16 to permit exposure and removal of gold layer 14. The etchant is preferably within the temperature range between 35° C. and 50° C., although the etching can be performed at room temperatures. The etchant step is much easier to control if maintained a temperature level within the preferred temperature range. If the temperature is below the preferred range, including room temperature, the film must be left in the etchant for a longer period of time. As a result the base etchant may begin to dissolve or loosen the pattern photoresist. By operating within the preferred temperature range, the time of etchant submersion can be made shorter and precisely controlled. The shorter time period insures that the photoresist on the submerged film will not be loosened or otherwise be damaged by the base etchant. As previously indicated, this ensurance from pattern damage is further enhanced by the pretreatment step.

The time period of submersion is typically 15 to 100 seconds, with longer submersion times being associated with lower temperatures of the preferred temperature range and shorter submersion times being associated with higher temperatures of the preferred range.

The ceramic layer 16 is thereby removed in the desired pattern areas exposing the underlying gold layer 14 during this etching step.

Post treatment of the film deals with removal of the exposed gold layer 16, parts of which may have been removed during the etching step. Initial removal of the exposed gold layer is accomplished by agitation in the etchant solution causing the gold layer to break up into particulate matter and flake off of the etched areas, leaving the exposed substrate 12. Any remaining particulate matter remaining in previously etched areas may be subsequently removed by a stream of fluid, such as, a stream of or gentle jet of water or removed mechanically with a foam swab or other swabbing material. In general, post treatment requires the forceable application of any of the above mediums to flake off and remove the exposed gold layer which is no longer adhesive to the substrate.

Figure 2B:
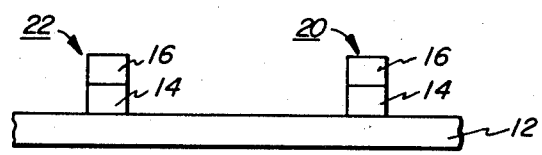

The film may then be thoroughly rinsed in water and the remaining photoresist removed by conventional techniques by using a solvent, such as, acetone, leaving an accurately defined conductive gold pattern 20 and 22 in the film, as illustrated in FIG. 2b.

It should be understood that the base etchant, potassium hydroxide, does not dissolve the gold layer. Gold is not solvent in this type of etchant. This base etchant is less dangerous to handle and is very much less caustic and not possessive of any toxic nature as the previously mentioned in connection with traditional gold etchants. The base etchant acts on the ceramic layer disrupting the ability of the underlying gold layer to remain effectively adhesive to the Mylar substrate.

EXAMPLE II

Intrex film was pretreated in the same manner as explained in Example I. A liquid photoresist GAF PR-115 was employed to delinate the film. The liquid photoresist was spun onto the pretreated film at 3000 RPM. The film was then baked at 75° to 80° C. in a nitrogen atmosphere for approximately 25 minutes. The film was then masked according to the desired pattern, exposed, and then developed in GAF D-014 developer.

Following development, the film was rinsed and dried and submerged in a potassium hydroxide solution and post treatment was performed on the gold layer in the manner previously described in connection with Example I.

Good results were achieved in that a precise uniform conductive gold pattern was formed in the film having no ragged or undercut edges.

It is not exactly known why the gold layer is physically removable without chemical treatment. It is believed that the gold layer includes a network of extremely small openings and that the overlayer 16 is applied to the surface of the gold layer 14 in a manner to penetrate into these openings during its deposition. The ceramic layer 16 adheres to the substrate 12 via these openings and also adheres to gold layer 14. The base etchant acts on the layer 16 alone with the corresponding portions of layer 14 being exposed. The surface tension and any adhesive quality of the layer 14 to substrate 12 in the exposed areas to believed to be reduced to an extent wherein any agitation in the etchant solution or application of a fluid medium to the exposed areas will cause the gold layer or particles thereof to flake off or be completely removed from these areas.

In summary, a safe and inexpensive method is provided for the removal of the gold layer of Intrex film employing conventional photolithographic techniques without the need of using traditional gold etchants, that are either very caustic or toxic or both, while eliminating any concern as to etchant attack on the pattern photoresist. The method is further enhanced by the employment of a pretreatment step, previously discussed.

While the invention has been described in conjunction with specific embodiments, it is evident that various alternatives, modifications and variations will be apparent to those skilled in the art in light of the foregoing description. Accordingly, it is intended to embrace all such alternatives, modifications, and variations as fall within the spirit and scope of the appended claims. For example, the method described hereinabove can be applied to other similarly configured films and that other appropriate base etchants could be utilized to define conductive patterns in the film 10. However, the invention is primarily directed to the use of lithographic techniques in conjunction with pretreatment, etching and postreatment procedures, disclosed herein, in defining patterns in Intrex type of film, such pattern definition having been successfully accomplished.

I claim:

1. A method of forming a defined conductive pattern in a laminar film, said film comprising a thin gold layer interposed between an insulating substrate and a thin ceramic overlayer, comprising the steps of:
    (a) forming an etch resistant pattern corresponding to said defined conductive pattern on said ceramic layer,
    (b) immersing the film in a base etchant both comprising potassium hydroxide for removing said ceramic layer in nonpattern areas while exposing said gold layer, the exposure of the gold layer permitting removal thereof chemically unassisted by said etchant, and
    (c) forceably applying a medium to said exposed gold layer causing the mechanical removal thereof in said nonpattern areas, wherein the step of applying a medium comprises either (A) agitating the film while immersed in the base etchant bath, (B) directing a fluid stream of a non-etchant for gold against the surface of the film, (C) swabbing the surface of the film with a non-etchant for gold, or, (D) a combination of such medium applications.

2. The method of claim 1 wherein said solution comprises 10% by weight of potassium hydroxide in water.

3. The method of claim 1 wherein said ceramic layer is coated with a photoresist, said photoresist coating being exposed to light through a masking pattern, said light being incident on said photoresist coating to form a pattern corresponding to said defined conductive pattern.

4. The method of claim 1 wherein there is included the step of pretreating the surface of the film with a solution of hexamethyldisilazane prior to etch resistant pattern formation.

5. The method of claim 1 wherein the step of immersion is preferably carried out with the temperature of the etchant being in a temperature range from 35° C. to 50° C.

6. The method of claim 5 wherein the time range of immersion is from 15 seconds to 100 seconds depending upon the temperature of the etchant.

7. A method of forming a defined conductive pattern in a laminar film, said film comprising a thin gold layer interposed between an insulating substrate and a thin ceramic overlayer, comprising the steps of:

(a) forming an etch resistant pattern corresponding to said defined conductive pattern on said ceramic layer, (b) providing a base etchant bath comprising potassium hydroxide, (c) maintaining the temperature of the etchant in a temperature range from 35° C. to 50° C., (d) chemically removing the ceramic layer in nonpattern areas by immersing the film in the base etchant bath thereby exposing the gold layer in said nonpattern areas, (e) mechanically removing the gold layer in said nonpattern areas by applying a medium to the surface of said exposed gold layer, wherein the step of applying a medium comprises either (A) agitating the film while immersed in the base etchant bath, (B) directing a fluid stream of a non-etchant for gold against the surface of the film, (C) swabbing the surface of the film with a non-etchant for gold, or, (D) a combination of such medium applications.

8. The method of claim 7 wherein the time of immersion of the film in the base etchant bath is from 15 seconds to 100 seconds depending on the selected temperature of the base etchant bath.

* * * * *